United States Patent
Yan

(10) Patent No.: US 9,842,525 B2
(45) Date of Patent: Dec. 12, 2017

(54) DISPLAY PANEL, DETECTION CIRCUIT, AND DETECTION METHOD THEREOF

(71) Applicants: AU Optronics (Xiamen) Corporation, Xiamen (CN); AU Optronics Corporation, Hsin-Chu (TW)

(72) Inventor: Hua-Sheng Yan, Xiamen (CN)

(73) Assignees: AU OPTRONICS (XIAMEN) CORPORATION, Xiamen (CN); AU OPTRONICS CORPORATION, Hsin-Chu (TW)

(*) Notice: Subject to any disclaimer, the term of this patent is extended or adjusted under 35 U.S.C. 154(b) by 26 days.

(21) Appl. No.: 14/856,932

(22) Filed: Sep. 17, 2015

(65) Prior Publication Data
US 2016/0293074 A1    Oct. 6, 2016

(30) Foreign Application Priority Data
Apr. 1, 2015    (CN) .......................... 2015 1 0151188

(51) Int. Cl.
H01L 29/10    (2006.01)
G09G 3/00    (2006.01)
H01L 27/12    (2006.01)

(52) U.S. Cl.
CPC ........... *G09G 3/006* (2013.01); *H01L 27/124* (2013.01); *G09G 2300/0426* (2013.01); *G09G 2330/12* (2013.01)

(58) Field of Classification Search
CPC ........ H01L 22/14; H01L 27/124; G09G 3/006
USPC ............................. 257/48; 438/18; 324/158
See application file for complete search history.

(56) References Cited

U.S. PATENT DOCUMENTS

2013/0271168 A1*   10/2013   Zhuang ................. G09G 3/006
                                                        324/750.3

FOREIGN PATENT DOCUMENTS

CN    102636928    8/2012
CN    103208264    7/2013

* cited by examiner

*Primary Examiner* — Jami M Valentine
(74) *Attorney, Agent, or Firm* — WPAT, PC

(57) ABSTRACT

A display panel includes a gate line, a data line, a first testing pad, a second testing pad, and a switching circuit. The gate line receives a gate-driving signal from a first node. The data line receives a data signal from a second node. The first testing pad transmits the gate-driving signal via one of a first reserved path and a first transmission path to the first node. The second testing pad transmits the data signal via one of a second reserved path and a second transmission path to the second node. The switching circuit selectively connects the first transmission path to the first node and connects the second transmission path to the second node. The first testing pad is connected to the first node via the first reserved path, and the second testing pad is connected to the second node via the second reserved path.

15 Claims, 4 Drawing Sheets

DISPLAY PANEL, DETECTION CIRCUIT, AND DETECTION METHOD THEREOF

RELATED APPLICATIONS

This application claims priority to China Application Serial Number 201510151188.4, filed Apr. 1, 2015, which is herein incorporated by reference.

BACKGROUND

Technical Field

The present disclosure relates to a display panel. More particularly, the present disclosure relates to a display panel having a detection circuit and a detection method thereof.

Description of Related Art

With the development of electronic products, the demand for display panels has been increasing. In order to improve yield rate, detection mechanisms are typically provided in the display panels during manufacture.

However, with respect to the present detection mechanisms, the turn-on resistance thereof is high, and thus the testing procedure must be performed with testing signals having a high voltage level, so as to maintain a regular driving capability. Moreover, when the connection between the detection mechanisms and the display panel is severed and it necessary to perform subsequent testing of the display panel, the display panel cannot be effectively re-tested via the detection mechanisms, resulting in inconvenience in subsequent operations.

SUMMARY

An aspect of the present disclosure is to provide a display panel. The display panel includes a gate line, a data line, a first testing pad, a second testing pad, and a switching circuit. The gate line is configured to receive a gate-driving signal from a first node. The data line is configured to receive a data signal from a second node. The first testing pad is configured to transmit the gate-driving signal to the first node via one of a first reserved path and a first transmission path. The second testing pad is configured to transmit the data signal to the second node via one of a second reserved path and a second transmission path. The switching circuit is configured to selectively connect the first transmission path to the first node, and to selectively connect the second transmission path to the second node according to a control signal. The first testing pad is connected to the first node via the first reserved path, and the second testing pad is connected to the second node via the second reserved path.

Another aspect of the present disclosure is to provide a detection circuit for testing a display panel. The detection circuit includes a first testing pad, a second testing pad, a first switch, and a second switch. A first terminal of the first switch is coupled to the first testing pad and the display panel via any one of a first reserved path and a first transmission path, a second terminal of the first switch is coupled to the first terminal of the first switch and the display panel via any one of the first reserved path and the first transmission path, and a control terminal of the first switch is configured to receive a control signal. A first terminal of the second switch is coupled to the second testing pad and the display panel via any one of a second reserved path and a second transmission path, a second terminal of the second switch is coupled to the first terminal of the second switch and the display panel via any one of the second reserved path and the second transmission path, and a control terminal of the second switch is configured to receive the control signal. The first reserved path and the first transmission path are partially overlapped, and the second reserved path and the second transmission path are partially overlapped.

Yet another aspect of the present disclosure is to provide a detection method for testing a display panel. The detection method includes the following operations: providing a first reserved path to a first testing pad, and providing a second reserved path to a second testing pad; providing a first transmission path to the first testing pad via a first switch, and providing a second transmission path to the second testing pad via a second switch, in which the first reserved path and the first transmission path are partially overlapped, and the second reserved path and the second transmission path are partially overlapped; transmitting a gate-driving signal to the display panel via the first reserved path from the first testing pad, and transmitting a data signal to the display panel via the second reserved path from the second testing pad, so as to perform a first display test; severing the first reserved path and the second reserved path by a laser process; turning on the first switch and the second switch according to a control signal; and transmitting the gate-driving signal to the display panel via the first transmission path from the first testing pad, and transmitting the data signal to the display panel via the second transmission path from the second testing pad, so as to perform a second display test.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
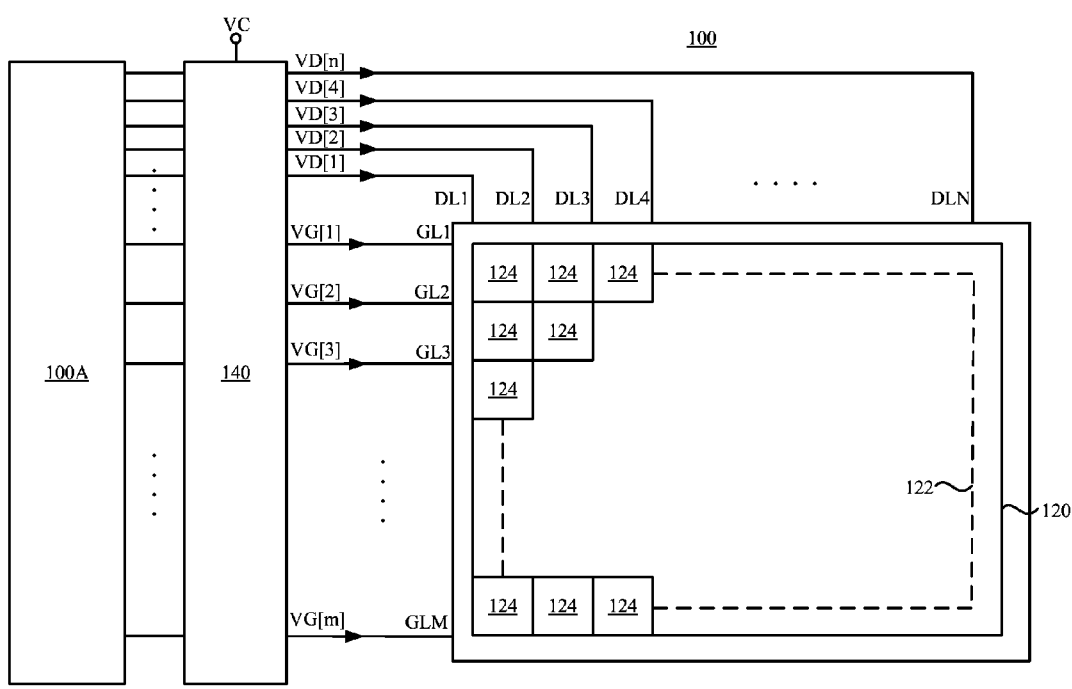
FIG. 1 is a schematic diagram of a display panel according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

In this document, the term "coupled" may also be termed as "electrically coupled," and the term "connected" may be termed as "electrically connected." "Coupled" and "connected" may also be used to indicate that two or more elements cooperate or interact with each other.

FIG. 1 is a schematic diagram of a display panel according to one embodiment of the present disclosure. As shown in FIG. 1, the display panel 100 includes a video display area 120 and a detection circuit 140.

The video display area 120 includes a pixel array 122, which is formed by data lines DL1-DLN and gate lines GL1-GLM, and pixels 124, in which the pixels 124 are disposed in the pixel array 122. The video display area 120 can display different images according to gate-driving signals VG[1]-VG[m] and data signals VD[1]-VD[n].

The detection circuit 140 is disposed at one side of the video display area 120, and is coupled to a cell testing machine 100A to receive the gate-driving signals VG[1]-VG[m] and the data signals VD[1]-VD[n]. The detection circuit 140 transmits those signals to the video display area 120 to test whether the video display area 120 is able to display images correctly. After the testing procedure is completed, the connection between the detection circuit 140 and the video display area 120 can be severed by an external cutting procedure, so that the video display panel 120 can start being driven by a panel driver (not shown) to display images. When further testing of the video display area 120 is required, the detection circuit 140 can be reconnected to the video display area 120 according to a control signal VC, so as to perform the subsequent operations.

The following paragraphs describe certain embodiments related to the detection circuit 140 to illustrate functions and applications thereof. However, the present disclosure is not limited to the following embodiments.

Figure 2A:
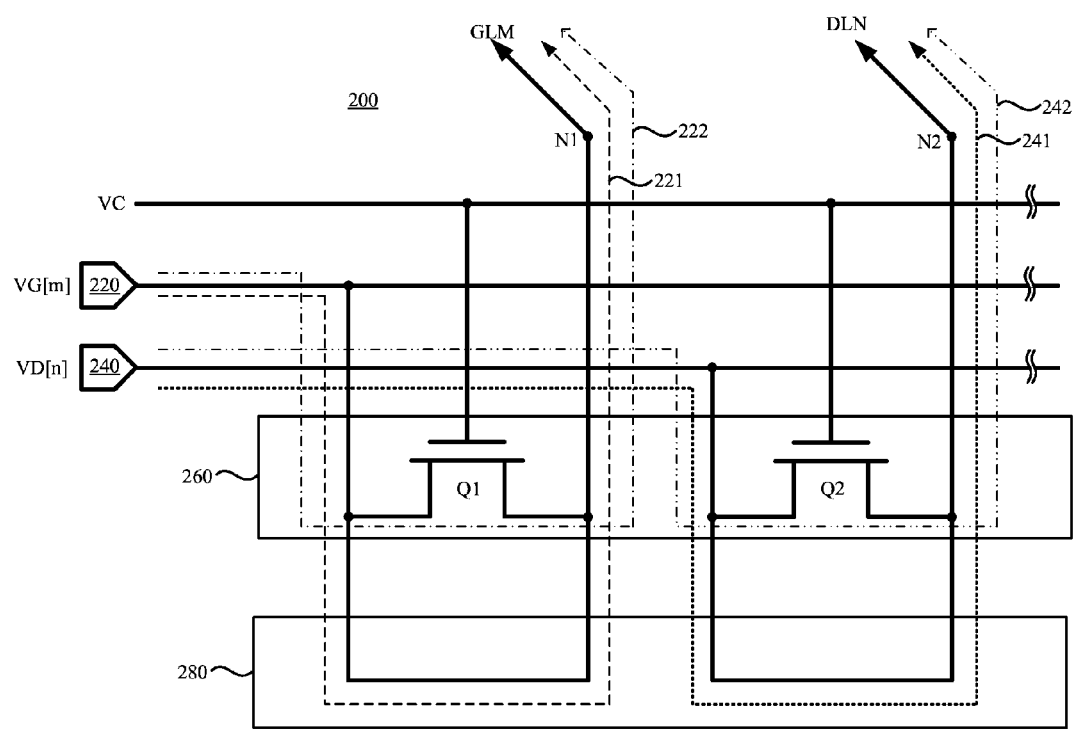
FIG. 2A is a schematic diagram of a detection circuit according to one embodiment of the present disclosure.

FIG. 2A is a schematic diagram of a detection circuit according to one embodiment of the present disclosure. As shown in FIG. 2A, the detection circuit 200 includes a testing pad 220, a testing pad 240, and a switching circuit 260.

For simplicity, the following examples are described with reference to a single gate line GLM and a single data line DLN to illustrate operations of the detection circuit 200. The gate line GLM is coupled to a node N1 to receive a gate-driving signal VG[m], and the data line DLN is coupled to a node N2 to receive a data signal VD[n].

The testing pad 220 is coupled to the cell testing machine (not shown) to receive the gate-driving signal VG[m], and to transmit the gate-driving signal VG[m] to the node N1 via one of a reserved path 221 and a transmission path 222. The testing pad 240 is coupled to the cell testing machine to receive the data signal VD[n], and to transmit the data signal VD[n] to the node N2 via one of a reserved path 241 and a transmission path 242.

The switching circuit 260 is coupled to the node N1, the node N2, the testing pad 220, and the testing pad 240. The switching circuit 260 is configured to selectively connect the transmission path 222 to the node N1, and to selectively connect the transmission path 242 to the node N2.

In some embodiments, as shown in FIG. 2A, the switching circuit 260 includes a switch Q1 and a switch Q2. The switch Q1 is coupled between the testing pad 220 and the node N1, and is configured to be selectively turned on according to the control signal VC. The switch Q2 is coupled between the testing pad 240 and the node N2, and is configured to be selectively turned on according to the control signal VC.

In greater detail, as shown in FIG. 2A, the transmission path 222 and the transmission path 242 include a first segment of wire and a second segment of wire, respectively. A first terminal of the switch Q1 is coupled to the testing pad 220 via any one of the reserved path 221 and the first segment of wire of the transmission path 222, so as to receive the gate-driving signal VG[m]. A second terminal of the first switch Q1 is coupled to the node N1, and is coupled to the first terminal of the switch Q1 via any one of the reserved path 221 and the second segment of wire of the transmission path 222. A control terminal of the switch Q1 is configured to receive the control signal VC. A first terminal of the switch Q2 is coupled to the testing pad 240 to receive the data signal VD[n]. A second terminal of the switch Q2 is coupled to the node N2 via any one of the reserved path 241 and the first segment of wire of the second transmission path 242, and is coupled to the first terminal of the switch Q2 via any one of the reserved path 241 and the second segment of wire of the transmission path 242. A control terminal of the switch Q2 is configured to receive the control signal VC.

Through such an arrangement, the first terminal of the switch Q1 and the second terminal of the switch Q1 are coupled with each other via the reserved path 221, and the first terminal of the switch Q2 and the second terminal of the switch Q2 are coupled with each other via the reserved path 241. In some embodiments, the reserved path 221 and the transmission path 222 are partially overlapped, and the reserved path 241 and the transmission path 242 are partially overlapped. In other words, with respect to the layout, in some embodiments, the reserved path 221 and the first segment of wire and the second segment of wire of the transmission path 222 are able to be implemented with the same wire, and the reserved path 241 and the first segment of wire and the second segment of wire of the transmission path 242 are able to be implemented with the same wire.

In various embodiments, the reserved path 221, the reserved path 241, the transmission path 241, and the transmission path 242 are disposed at the same side of the video display area 120. In other words, the detection circuit 200 can be disposed in the display panel 100 without extra wires. As a result, the area of the detection circuit 200 can be reduced.

As shown in FIG. 2A, when the switches Q1 and Q2 are in a conduction state, the testing pad 220 can be directly coupled to the node N1 and the gate line GLM via the reserved path 221, and the testing pad 240 can be directly coupled to the node N2 and the data line DLN via the reserved path 241. Thus, in an initial testing procedure, a turn-on resistance corresponding to the transmission path for the gate-driving signal VG[m] and a turn-on resistance corresponding to the transmission path for the data signal VD[n] can be reduced. This ensures that the gate-driving signal VG[m] and the data signal VD[n] are prevented from distortion when being transmitted, and are therefore sufficient to drive the display panel.

Figure 2B:
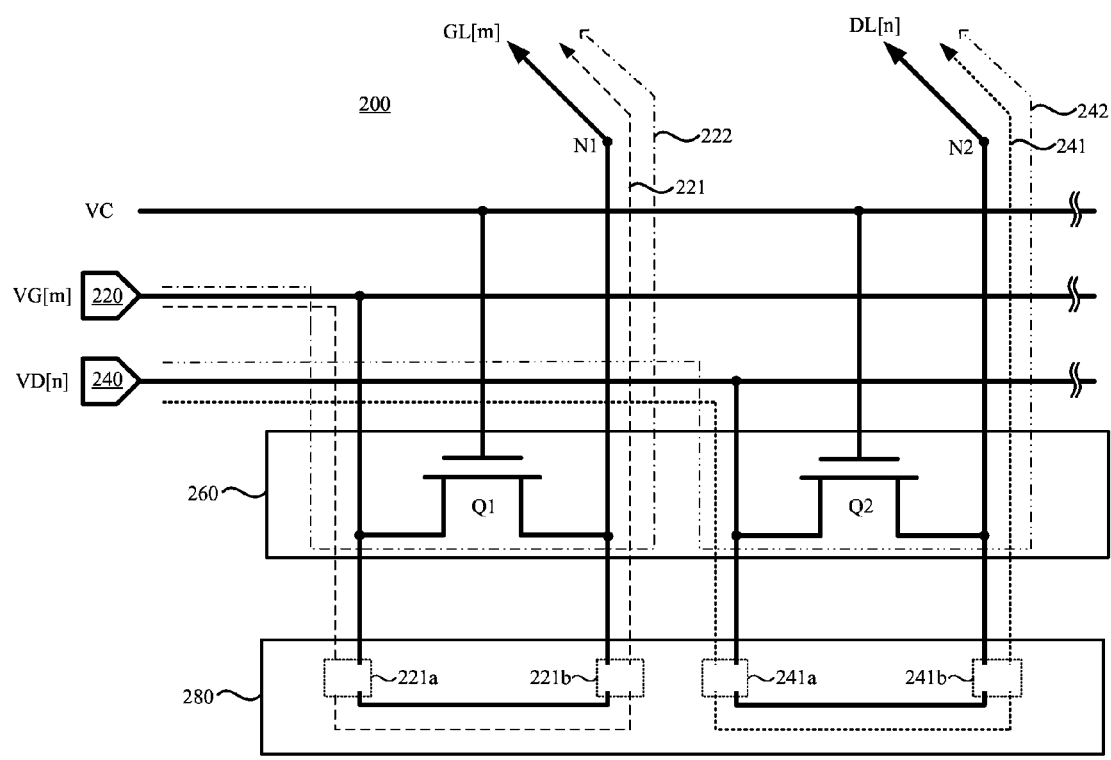
FIG. 2B is a schematic diagram illustrating reserved paths of the detection circuit in FIG. 2A after being severed.

FIG. 2B is a schematic diagram illustrating the reserved paths of the detection circuit in FIG. 2A after being severed.

As shown in FIG. 2A, by using pre-defined layouts, the reserved path 221 and the reserved path 241 can substantially form a predetermined sever area 280 at a lower side of the switching circuit 260. In the predetermined sever area 280, the connections between the reserved path 221, the reserved path 241, the switch Q1 and the switch Q2 can be severed by an external cutting process (e.g., laser process).

For example, when the wire in the predetermined sever area 280 corresponding to the reserved path 221 is severed by a laser process, the first terminal of the switch Q1 and the second terminal of the switch Q1 cannot be coupled with each other via the reserved path 221. Similarly, when the wire in the predetermined sever area 280 corresponding to the reserved path 241 is severed by a laser process, the first terminal of the switch Q2 and the second terminal of the switch Q2 cannot be coupled with each other via the reserved path 241. As a result, the detection circuit 200 cannot directly transmit the gate-driving signal VG[m] and the data signal VD[n] to the node N1 and the node N2. Thus, the video display area 120 can start being driven by the panel driver (not shown) to display images.

Furthermore, in some embodiments, as shown in FIG. 2B, by using pre-defined layouts, the wire in the predetermined sever area 280 corresponding to the reserved path 221 at least has a segment 221a and a segment 221b, and the wire in the predetermined sever area 280 corresponding to the reserved path 241 at least has a segment 241a and a segment 241b. The segment 221a and the segment 221b are separated and in one embodiment, are in parallel with each other, and the segment 241a and the segment 241b are separated, and in one embodiment, are in parallel with each other. As a result, as long as at least one of the segment 221a and the segment 221b is severed by a laser process, the connection between the first terminal of the switch Q1 and the second terminal of the switch Q1 can be severed. Similarly, as long as at least one of the segment 241a and the segment 241b is severed by a laser process, the connection between the first terminal of the switch Q2 and the second terminal of the switch Q2 can be severed. Through such an arrangement, the accuracy of the operation of the external severing process can be improved, and thus the video display area 120 can be kept being driven by the panel driver (not shown) in subsequent operations.

As shown in FIG. 2B, after the initial testing procedure, if the video display area 120 is required to be further tested, the switch Q1 and the switch Q2 can be turned on by modulating the control signal VC to a high voltage level. As a result, the testing pad 220 can transmit the gate-driving signal VG[m] to the node N1 via the transmission path 222, and the testing pad 240 can transmit the data signal VD[n] to the node N2 via the transmission path 242, so as to perform the subsequent testing operations.

With the transmission path 222 and the transmission path 242, the display panel 100 can be repeatedly tested through the detection circuit 200 according to actual requirements. By switching the control signal VC, the display panel 100 can be driven by the panel driver after being tested.

Figure 3:
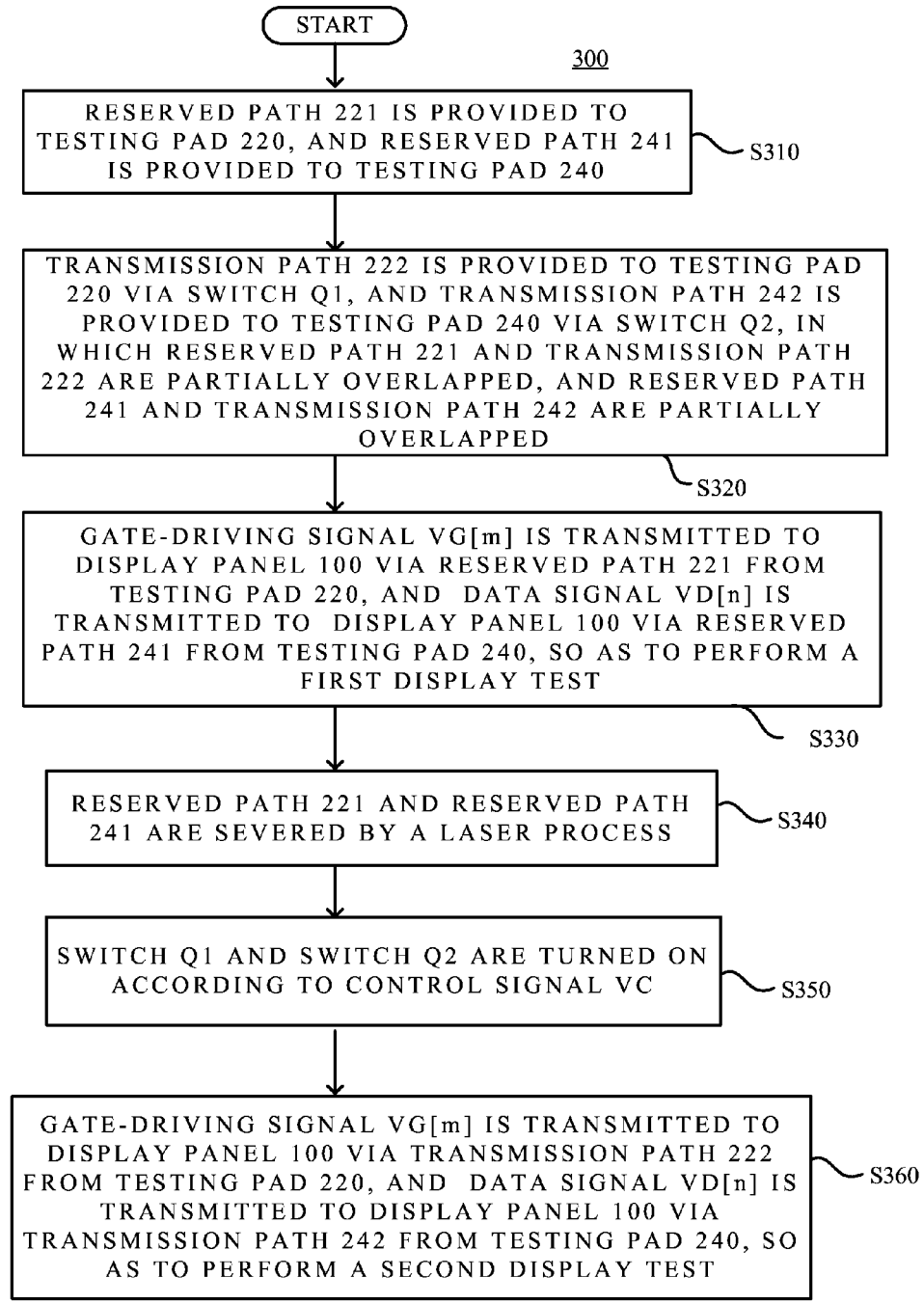
FIG. 3 is a flowchart of a detection method for a display panel according to one embodiment of the present disclosure.

FIG. 3 is a flowchart of a detection method for a display panel according to one embodiment of the present disclosure. To facilitate the discussion to follow, reference is made to FIG. 2A, FIG. 2B, and FIG. 3, and the operations of the detection method 300 are described with reference to the detection circuit 200 in FIG. 2A and FIG. 2B.

As shown in FIG. 3, the detection method 300 includes step S310, step S320, step S330, step S340, step S350, and step S360. In step S310, the reserved path 221 is provided to the testing pad 220, and the reserved path 241 is provided to the testing pad 240.

In step S320, the transmission path 222 is provided to the testing pad 220 via the switch Q1, and the transmission path 242 is provided to the testing pad 240 via the switch Q2, in which the reserved path 221 and the transmission path 222 are partially overlapped, and the reserved path 241 and the transmission path 242 are partially overlapped.

In step S330, the gate-driving signal VG[m] is transmitted to the display panel 100 via the reserved path 221 from the testing pad 220, and the data signal VD[n] is transmitted to the display panel 100 via the reserved path 241 from the testing pad 240, so as to perform a first display test.

For example, as shown in FIG. 2A, the testing pad 220 is coupled to the node N1 via both of the reserved path 221 and the transmission path 222, and the testing pad 240 is coupled to the node N2 via both of the reserved path 241 and the transmission path 242. The testing pad 220 and the testing pad 240 are coupled to a cell testing machine (e.g., the cell testing machine 100A shown in FIG. 1) to receive the gate-driving signal VG[m] and the data signal VD[n], respectively. As a result, the gate-driving signal VG[m] can be transmitted to the gate line GLM in the display panel 100 through the testing pad 220 and the reserved path 221, and the data signal VD[n] can be transmitted to the data line DLN in the display panel 100 through the testing pad 240 and the reserved path 241. A plurality of the gate-driving signals VG[1]-VG[m] and a plurality of the data signals VD[1]-VD[n] can be sequentially transmitted to the display panel 100 in an analogous manner, so that the initial display test can be performed on the display panel 100.

With continued reference to FIG. 3, in step S340, the reserved path 221 and the reserved path 241 are severed by a laser process. In step S350, the switch Q1 and the switch Q2 are turned on according to the control signal VC. In step S360, the gate-driving signal VG[m] is transmitted to the display panel 100 via the transmission path 222 from the testing pad 220, and the data signal VD[n] is transmitted to the display panel 100 via the transmission path 242 from the testing pad 240, so as to perform a second display test.

For example, as shown in FIG. 2B, after the wires in the predetermined sever area 280 corresponding to the reserved path 221 and the reserved path 241 are severed by a laser process, the testing pad 220 is coupled to the node N1 only via the switch Q1 and the transmission path 222, and the testing pad 240 is coupled to the node N2 only via the switch Q2 and the transmission path 242. When the control signal VC is switched to be at the high voltage level, the switch Q1 and the switch Q2 are turned on. As a result, the testing pad 220 can receive the gate-driving signal VG[m] from the cell testing machine (not shown), and can transmit the gate-driving signal VG[m] to the gate line GLM via the transmission path 222. Similarly, the testing pad 240 can receive the data signal VD[n] from the cell testing machine (not shown), and can transmit the data signal VD[n] to the data line DLN via the transmission path 222. Thus, the display panel 100 can be further tested.

In summary, the display panel, the detection circuit, and the test method of the present disclosure can achieve a low turn-on resistance by using the reserved path, so as to prevent the test signals from distortion during the display test. The detection circuit can test the display panel again with an additional control signal VC, and thus the convenience of the display testing is improved. In addition, the detection circuit can be disposed in the display panel without extra wires, and the area of the detection circuit is thus significantly reduced, thereby minimizing overall cost.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims.

What is claimed is:
1. A display panel, comprising:
   a gate line configured to receive a gate-driving signal from a first node;
   a data line configured to receive a data signal from a second node;
   a first testing pad configured to transmit the gate-driving signal to the first node via one of a first reserved path and a first transmission path;

a second testing pad configured to transmit the data signal to the second node via one of a second reserved path and a second transmission path; and a switching circuit configured to selectively connect the first transmission path to the first node, and to selectively connect the second transmission path to the second node according to a control signal;

wherein the first testing pad is connected to the first node via the first reserved path, and the second testing pad is connected to the second node via the second reserved path;

wherein the first reserved path and the first transmission path are partially overlapped, and the second reserved path and the second transmission path are partially overlapped.

2. The display panel of claim 1, wherein the first testing pad is directly connected to the gate line via the first reserved path, and the second testing pad is directly connected to the data line via the second reserved path.

3. The display panel of claim 1, wherein the switching circuit comprises:

a first switch coupled between the first testing pad and the first node, and configured to be selectively turned on according to the control signal; and a second switch coupled between the second testing pad and the second node, and configured to be selectively turned on according to the control signal.

4. The display panel of claim 3, wherein a first terminal of the first switch is coupled to the first testing pad to receive the gate-driving signal, a second terminal of the first switch is coupled to the first node and is coupled to the first terminal of the first switch via both of the first reserved path and the first transmission path, and a control terminal of the first switch is configured to receive the control signal.

5. The display panel of claim 3, wherein a first terminal of the second switch is coupled to the second testing pad to receive the data signal, a second terminal of the second switch is coupled to the second node and is coupled to the first terminal of the second switch via both of the second reserved path and the second transmission path, and a control terminal of the second switch is configured to receive the control signal.

6. The display panel of claim 1, wherein the first reserved path and the second reserved path are configured to form a predetermined sever area, and a first segment of the first reserved path in the predetermined sever area is disposed in parallel with a second segment of the first reserved path in the predetermined sever area.

7. The display panel of claim 6, wherein a first segment of the second reserved path in the predetermined sever area is disposed in parallel with a second segment of the second reserved path in the predetermined sever area.

8. A detection circuit for testing the display panel of claim 1, the detection circuit comprising:

the first testing pad;

the second testing pad;

a first switch in the switching circuit, wherein a first terminal of the first switch is coupled to the first testing pad and the display panel via any one of the first reserved path and the first transmission path, a second terminal of the first switch is coupled to the first terminal of the first switch and the display panel via any one of the first reserved path and the first transmission path, and a control terminal of the first switch is configured to receive the control signal; and a second switch in the switching circuit, wherein a first terminal of the second switch is coupled to the second testing pad and the display panel via any one of the second reserved path and the second transmission path, a second terminal of the second switch is coupled to the first terminal of the second switch and the display panel via any one of the second reserved path and the second transmission path, and a control terminal of the second switch is configured to receive the control signal;

wherein the first reserved path and the first transmission path are partially overlapped, and the second reserved path and the second transmission path are partially overlapped.

9. The detection circuit of claim 8, wherein the display panel comprises a display area, and the first reserved path, the second reserved path, the first transmission path, and the second transmitting path are disposed at one side of the display area.

10. The detection circuit of claim 8, wherein the display panel comprises a gate line and a data line, the second terminal of the first switch is coupled to the gate line, and the second terminal of the second switch is coupled to the data line.

11. The detection circuit of claim 8, wherein the first reserved path and the second reserved path are configured to form a predetermined sever area, and a first segment of the first reserved path in the predetermined sever area is disposed in parallel with a second segment of the first reserved path in the predetermined sever area.

12. The detection circuit of claim 11, wherein a first segment of the second reserved path in the predetermined sever area is disposed in parallel with a second segment of the second reserved path in the predetermined sever area.

13. A detection method for testing the display panel of claim 1, the detection method comprising:

providing the first reserved path to the first testing pad, and providing the second reserved path to the second testing pad;

providing the first transmission path to the first testing pad via a first switch in the switching circuit, and providing the second transmission path to the second testing pad via a second switch in the switching circuit, wherein the first reserved path and the first transmission path are partially overlapped, and the second reserved path and the second transmission path are partially overlapped;

transmitting the gate-driving signal to the display panel via the first reserved path from the first testing pad, and transmitting the data signal to the display panel via the second reserved path from the second testing pad, so as to perform a first display test;

severing the first reserved path and the second reserved path by a laser process;

turning on the first switch and the second switch according to the control signal; and transmitting the gate-driving signal to the display panel via the first transmission path from the first testing pad, and transmitting the data signal to the display panel via the second transmission path from the second testing pad, so as to perform a second display test.

14. The detection method of claim 13, further comprising:

disposing a first segment of the first reserved path in a predetermined sever area to be parallel with a second segment of the first reserved path in the predetermined sever area; and disposing a first segment of the second reserved path in the predetermined sever area to be in parallel with a second segment of the second reserved path in the predetermined sever area.

15. The detection method of claim 13, further comprising:
disposing the first reserved path, the second reserved path, the first transmission path, and the second transmitting path at one side of the display panel.

* * * * *